United States Patent
Kadirel et al.

(10) Patent No.: US 8,149,040 B2
(45) Date of Patent: Apr. 3, 2012

(54) APPARATUS FOR GENERATING A PLURALITY OF DIFFERENT VOLTAGE LEVEL CLOCK SIGNALS

(75) Inventors: Karthik Kadirel, Melbourne, FL (US); Umar Jameer Lyles, Palm Bay, FL (US); John H. Carpenter, Jr., Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 12/836,865

(22) Filed: Jul. 15, 2010

(65) Prior Publication Data
US 2012/0013380 A1    Jan. 19, 2012

(51) Int. Cl.
*G06F 1/04* (2006.01)
*H03K 3/00* (2006.01)
(52) U.S. Cl. ........ 327/295; 327/164; 327/184; 327/256; 327/257; 327/285
(58) Field of Classification Search .................. 327/285, 327/287, 295, 296
See application file for complete search history.

(56) References Cited

U.S. PATENT DOCUMENTS
5,783,960 A * 7/1998 Lackey ..................... 327/295
* cited by examiner

*Primary Examiner* — Lincoln Donovan
*Assistant Examiner* — John Poos
(74) *Attorney, Agent, or Firm* — William B. Kempler; Wade J. Brady, III; Frederick J. Telecky, Jr.

(57) ABSTRACT

A system is provided for generating a plurality of different voltage level clock signals. The system comprises an electrical energy storage pack having a plurality of series coupled electrical energy storage cells that provide a plurality of different output voltage level, a reference oscillator that provides a reference clock signal and a plurality of voltage clamps that receive the plurality of different output voltage levels and output the plurality of different voltage level clock signals at respective output nodes. The plurality of voltage clamps are configured to clamp each of a given output node to a respective high-side voltage level in response to pulling up of the given output node toward a respective high output voltage level and to clamp each of the given output node to a respective low-side voltage level in response to pulling down of the output node toward a low output voltage level.

20 Claims, 3 Drawing Sheets

US 8,149,040 B2

APPARATUS FOR GENERATING A PLURALITY OF DIFFERENT VOLTAGE LEVEL CLOCK SIGNALS

TECHNICAL FIELD

This invention relates to electronics, and more specifically, to apparatus for generating a plurality of different voltage level clock signals.

BACKGROUND

Electrical energy storage packs (e.g., battery packs) consist of multiple cells that are connected in parallel and/or series to achieve a required voltage and power rating. Systems that utilize these electrical energy storage packs include circuits that operate across the full voltage of the electrical energy storage pack, referred to as ground reference circuits and circuits that operate across individual electrical energy storage cells, referred to as cell referenced circuits. The cell referenced circuits provide the advantage that the current employed to drive the circuit can be reused to charge another electrical energy storage cell in the electrical energy storage pack. In certain multiple cell systems, a ground referenced logic or clock signal needs to be translated to one or more different cell referenced logic or clock signal levels. One solution is to employ a series of cascaded level shifters to provide the one or more different cell referenced logic or clock signal levels. However, the problem with this solution is that each difference cell referenced level is delayed by a clock transition.

SUMMARY

In one aspect of the invention, a system is provided for generating a plurality of different voltage level clock signals. The system comprises an electrical energy storage pack having a plurality of series coupled electrical energy storage cells that provide a plurality of different output voltage level, a reference oscillator that provides a reference clock signal and a plurality of voltage clamps that receive the plurality of different output voltage levels and output the plurality of different voltage level clock signals at respective output nodes. The plurality of voltage clamps are configured to clamp each of a given output node to a respective high-side voltage level in response to pulling up of the given output node toward a respective high output voltage level and to clamp each of the given output node to a respective low-side voltage level in response to pulling down of the output node toward a low output voltage level. The system further comprises a rail selector that selects between pulling up each output node toward a high output voltage level and pulling down each output node toward a low output voltage level based on different states of the reference clock signal.

In another aspect of the invention, a circuit is provided for generating a plurality of different voltage level clock signals. The circuit comprises electrical energy storage pack having a plurality of series coupled electrical energy storage cells that provide a plurality of different output voltage levels, a ground reference oscillator that provides a ground reference clock signal and a plurality of series coupled transistor clamps that receive the plurality of different output voltage levels and output the plurality of different voltage level clock signals at respective output nodes. The plurality of series coupled transistor clamps include a high-side transistor clamp and a low-side transistor clamp associated with each output node. The high-side transistor clamp clamps a respective output node at a respective high-side voltage level in response to pulling up the given output node toward a high output voltage level and the low-side transistor clamp clamps the respective output node at a respective low-side voltage level in response to pulling down the given output node toward a low output voltage level. The circuit further comprises a rail selector that selects between pulling up each output node toward a high output voltage level and pulling down each output node toward a low output voltage level based on different states of the ground reference clock signal.

In yet another aspect of the invention, a system is provided for generating a plurality of different voltage level clock signals. The system comprises means for providing a plurality of different output voltage levels, means for providing a reference clock signal and means for clamping the plurality of different voltage level clock signals between a high-side voltage level and a low-side voltage level. The means for clamping receives the plurality of different output voltage levels and outputs the plurality of different voltage level clock signals at respective output nodes. The means for clamping is configured to clamp each of a given output node to a respective high-side voltage level in response to pulling up of the given output node toward a respective high output voltage level and to clamp each of the given output node to a respective low-side voltage level in response to pulling down of the output node toward a low output voltage level. The system further comprises means for selecting between pulling up each output node toward a high output voltage level and pulling down each output node toward a low output voltage level based on different states of the reference clock signal.

DETAILED DESCRIPTION

Figure 1:
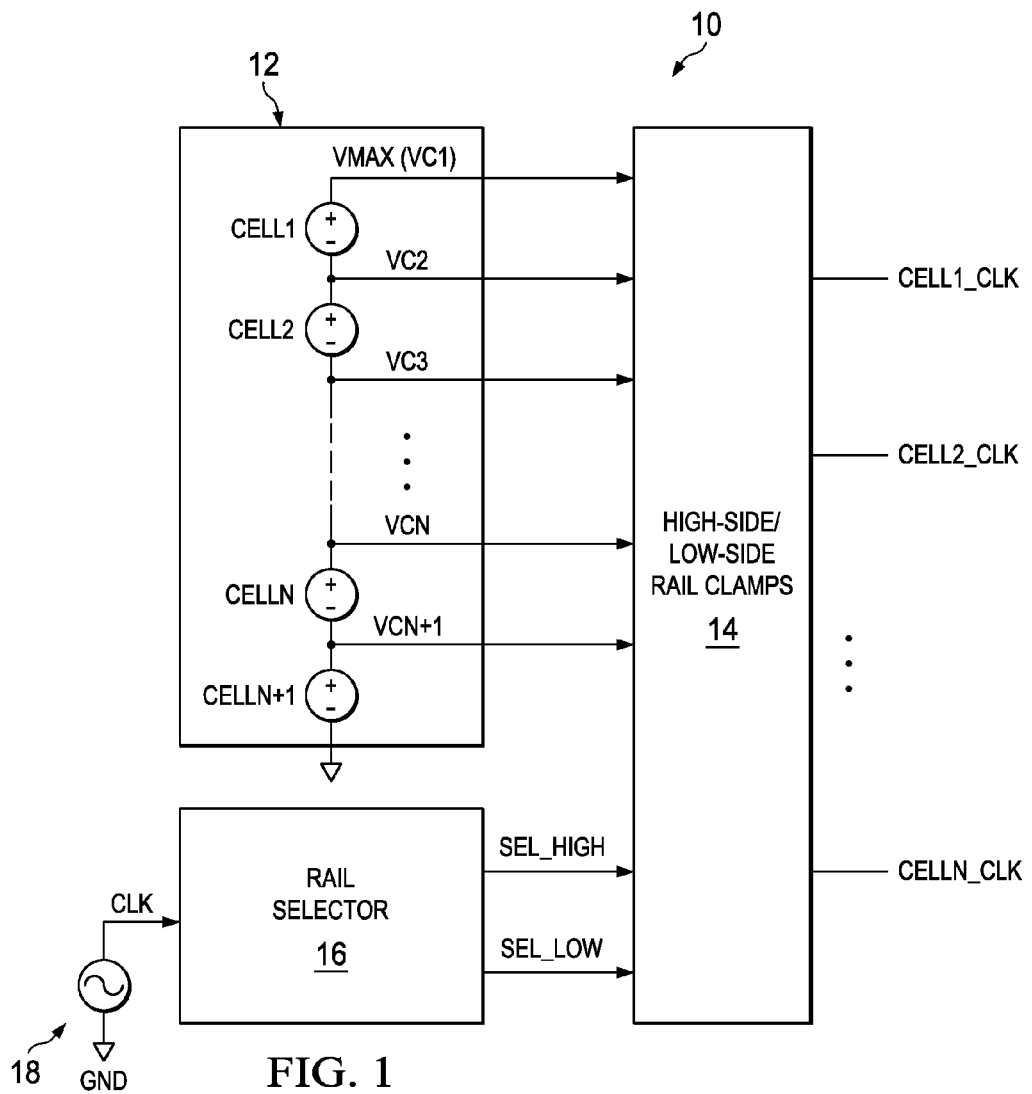
FIG. 1 illustrates a system for generating a plurality of different voltage level clock signals in accordance with an aspect of the present invention.

FIG. 1 illustrates a representative schematic of a system 10 for generating a plurality of different voltage level clock signals in accordance with an aspect of the present invention. The system 10 employs an electrical energy storage pack 12 having a plurality of electrical energy storage cells stacked in series, labeled cell 1 to cell N+1, to provide a plurality of different output voltage levels to generate a plurality of different voltage level clock signals, labeled CELL1_CLK to CELLN_CLK, where N is an integer greater than one. The electrical energy storage pack 12 can be one or more rechargeable batteries, primary batteries, supercapacitors or fuel cells in addition to other rechargeable electrical energy storage devices. The voltage at the top of the stack is denoted as VMAX and the individual cell voltages at the positive terminals of the electrical energy storage cells are VC1, VC2 through VCN. The top voltage and individual cell voltages are provided to a plurality of high-side voltage rail and low-side voltage rail clamps 14 where at least one high-side voltage rail clamp and at least one low-side voltage rail clamp is associated with a given clock signal of a plurality of different voltage level clock signals. The at least one high-side voltage rail clamp is configured to clamp a given clock signal at a high-side voltage level rail and the at least one low-side voltage rail clamp is configured to clamp the given clock signal at a low-side voltage level rail. The term "voltage level" denotes the actual voltage level of an output node due to errors and/or voltage drops associated with the clamping, while the term "output voltage level" denotes a desired rail voltage which is a voltage level output of one of the electrical energy storage cells.

An oscillator 18 provides a ground reference clock signal (CLK) to a rail selector 16. The rail selector 16 is configured to select between pulling up each given clock signal toward a high output voltage level rail and pulling down each clock signal toward a low output voltage level rail. For example, when the ground reference oscillator 18 is at a high-side voltage rail state (e.g., at VCN), the rail selector 16 selects pulling up each given clock signal toward a high output voltage level rail. The high-side voltage rail clamp clamps each given clock signal at a high-side voltage level rail associated with the given clock signal. Furthermore, when the ground reference oscillator 16 is at a low-side voltage rail state (e.g., GND), the rail selector 16 selects pulling down each given clock signal toward a low output voltage rail. The low-side voltage rail clamps clamp each given clock signal at a low-side voltage level rail associated with the given clock signal. This provides a first clock output signal (CELL_CLK) that toggles between about VMAX (VC1) and about VC2, a second clock output signal (CELL2_CLK) that toggles between about VC2 and about VC3 through an Nth clock signal (CELLN_CLK) that toggles between about VCN and about VCN+1. An error correction device at the output node of the clock signals such as an inverter and buffer can correct the errors associated with the clamping devices.

Figure 2:
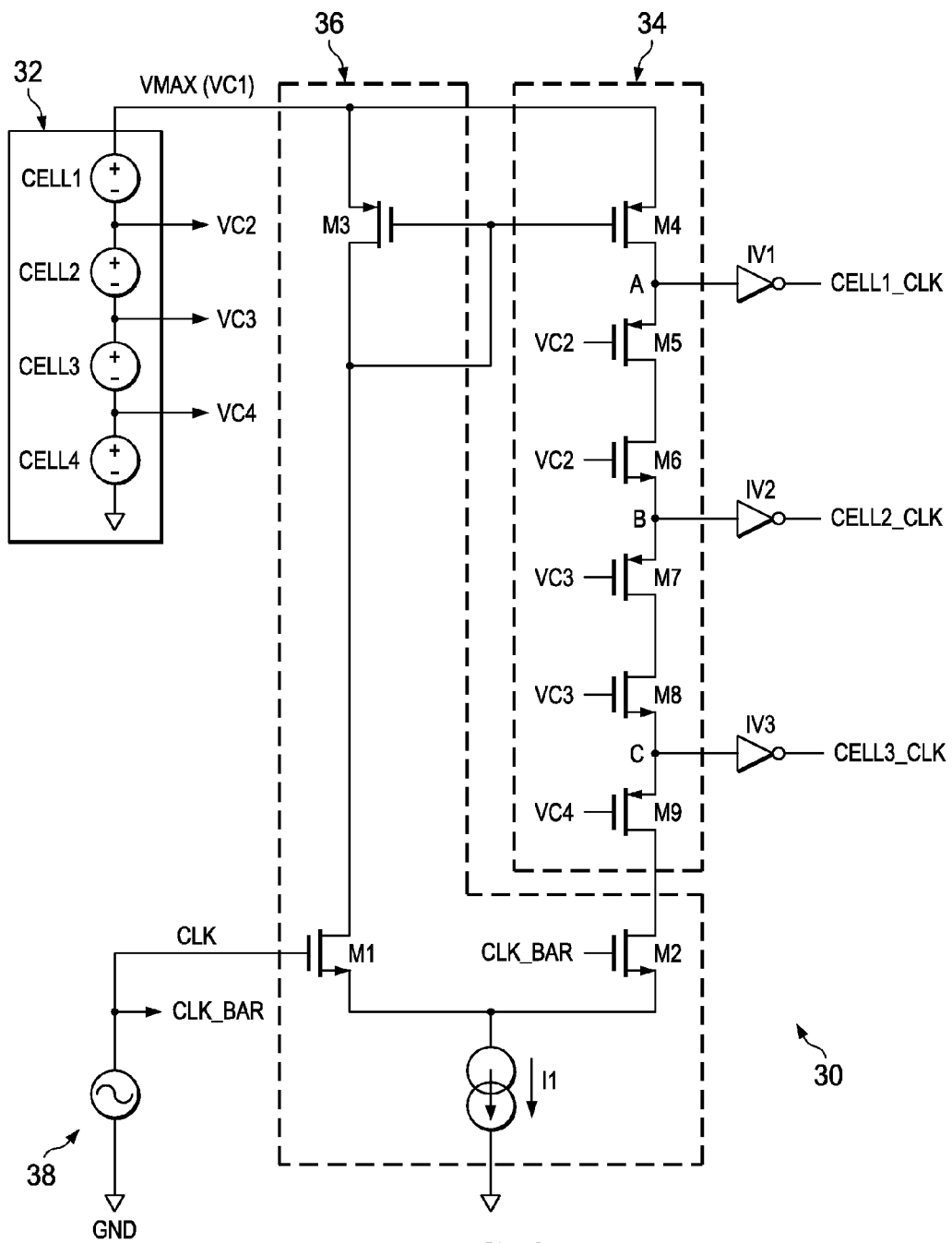
FIG. 2 illustrates a circuit for generating a plurality of different voltage level clock signals in accordance with an aspect of the present invention.

FIG. 2 illustrates a representative schematic of a circuit 30 for generating a plurality of different voltage level clock signals in accordance with an aspect of the present invention. The circuit 30 employs an electrical energy storage pack 32 having a plurality of electrical energy storage cells stacked in series labeled CELL1, CELL 2, CELL 3 and CELL 4, to provide a plurality of different output voltage levels to generate a plurality of different voltage level clock signals, labeled CELL1_CLK to CELL3_CLK. The voltage at the top of the stack is denoted as VMAX and the individual cell voltages at the positive terminals of the electrical energy storage cells are VC1, VC2, VC3 and VC4. The top voltage and individual cell voltage are provided to a plurality of high-side voltage rail and low-side voltage rail clamping transistors M4, M5, M6, M7, M8, and M9 that provide a plurality of high-side voltage rail and low-side voltage rail clamps 34. Top voltage VMAX is provided to the drain of M4, cell voltage VC2 is provided to the gates of M5 and M6, cell voltage VC3 is provided to the gates of M7 and M8 and cell voltage VC4 is provided to the gate of M9.

A current source $I_1$ (e.g., 200 nA) is enabled using switches M1 and M2, which collectively along with M3 form a rail selector 36. Switches M1 and M2 are driven by the inverted (CLK_BAR) and non-inverted (CLK) output of a ground reference oscillator 38. Switch M1 is connected to the diode connected transistor of a current mirror consisting of M3 and M4. M4 is a high-side voltage clamp for a first voltage level clock signal CELL1_CLK and M5 is a low-side voltage clamp for the first voltage level clock signal CELL1_CLK, such that CELL1_CLK toggles between VMAX and VC2. M6 is a high-side voltage clamp for a second voltage level clock signal CELL2_CLK and M7 is a low-side voltage clamp for the second voltage level clock signal CELL2_CLK, such that CELL2_CLK toggles between VC2 and VC3. M8 is a high-side voltage clamp for a third voltage level clock signal CELL3_CLK and M9 is a low-side voltage clamp for the third voltage level clock signal CELL3_CLK, such that CELL3_CLK toggles between VC3 and VC4.

The node voltages at A, B, C are inverted using inverters IV1, IV2 and IV3. The inverters correct for the voltage drops caused by the clamp transistors M4-M9. For example, it can be seen from the circuit 30 that the voltage swing at node A is limited by transistor M4 and M5 to $V_{MAX}-V_{dsM4}$ and $VC_2+V_{tp}$, respectively. Similarly, the voltage at node B is limited by transistors M6 and M7 to $VC_2-V_{tn}$ to $VC_3+Vtp$ respectively. The voltage at node C is limited by transistors M8 and M9 to $VC_3-V_{tn}$ to $VC_4+V_{tp}$, respectively. The inverters correct the voltage drops caused by the clamp transistors. It is to be appreciated that other means such as a buffer could be employed to correct for the voltage drops caused by the clamp transistors M4-M9.

The input to the circuit 30 is the non-inverted and inverted output of a 0-5V oscillator 38 that is applied to the gates of M1 and M2, respectively. When the clock signal is high, switch M1 is closed causing the gate of M2 to be at a threshold voltage Vt below VMAX. This turns M4 on which causes node A, B and C to pull up via high-side clamps M4, M6 and M8 to $V_{MAX}-V_{dsM4}$, $VC_2-V_{tn}$, and $VC_3-V_{tn}$, respectively. The inverters at nodes A, B and C drive this input voltage to a logic low which corresponds to a voltage of VC2, VC3 and VC4, respectively. When the clock signal is low, switch M1 is open and M2 is closed. The turning on of M2 causes node A, B and C to pull down via low-side clamps M5, M7 and M9 to $VC_2+V_{tn}$, $VC_3+V_{tn}$ and $VC_4+V_{tn}$, respectively. The inverters at nodes A, B and C drive this input voltage to a logic high which corresponds to a voltage of VMAX, VC2, and VC3, respectively.

Figure 3:
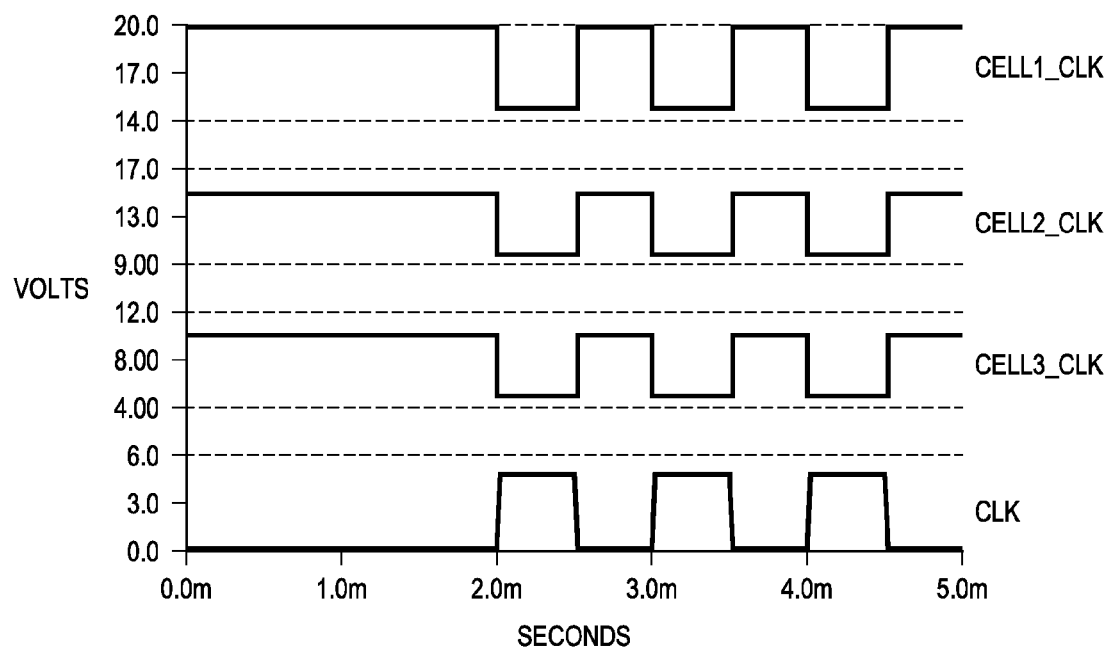
FIG. 3 illustrates a graphical representation of simulation results of the circuit illustrated in FIG. 2.

FIG. 3 illustrates a graphical representation 50 of simulation results of the circuit illustrated in FIG. 2. The graphical representation 50 plots the voltage over time of the plurality of different voltage level signals generated by the circuit of FIG. 2 with VMAX=20 volts, VC2=15 volts, VC3=10 volts and VC4=5 volts. The reference clock signal (CLK) is the input ground referenced clock signal generated by the reference ground oscillator that toggles between 5 volts and ground. The output of each of the inverters IV1, IV2 and IV3 is shown. It can be seen that the input 0-5V signal is translated to the first clock signal CELL1_CLK which toggles between 20 volts and 15 volts, the second voltage level clock signal CELL2_CLK toggles between 15 volts and 10 volts and the third voltage level clock signal CELL3_CLK toggles between 10 volts and 5 volts.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A system for generating a plurality of different voltage level clock signals, the system comprising:
   an electrical energy storage pack having a plurality of series coupled electrical energy storage cells that provide a plurality of different output voltage levels;
   a reference oscillator that provides a reference clock signal;
   a plurality of voltage clamps that receive the plurality of different output voltage levels and output the plurality of different voltage level clock signals at respective output nodes, the plurality of voltage clamps being configured to clamp each of a given output node to a respective high-side voltage level in response to pulling up of the given output node toward a respective high output voltage level and to clamp each of the given output node to a respective low-side voltage level in response to pulling down of the output node toward a low output voltage level; and a rail selector that selects between pulling up each output node toward a high output voltage level and pulling down each output node toward a low output voltage level based on different states of the reference clock signal.

2. The system of claim 1, wherein the reference oscillator is a ground reference oscillator.

3. The system of claim 1, wherein the plurality of voltage clamps include a high-side voltage clamp and a low-side voltage clamp associated with each output node, the high-side voltage clamp clamps a respective output node at the respective high-side voltage level and the low-side voltage clamp clamps the respective output node at the respective low-side voltage level.

4. The system of claim 3, wherein each of the high-side voltage clamps are coupled to a respective high voltage output level and each of the low-side voltage clamps are coupled to a respective low output voltage level associated with a given different voltage level clock signal.

5. The system of claim 4, wherein the high-side voltage clamp and the low-side voltage clamp associated with a respective node are series coupled to one another.

6. The system of claim 1, wherein the plurality of voltage clamps are transistor clamps coupled to one another in a series configuration.

7. The system of claim 6, further comprising an inverter coupled to each output node to correct errors associated with the voltage drops across the transistor clamps.

8. The system of claim 1, wherein the rail selector comprises a first transistor that selects pulling up the output nodes toward a top voltage of the electrical energy storage pack during a first state of the reference clock signal and a second transistor that selects pulling down the output nodes toward a bottom voltage of the electrical energy storage pack during a second state of the reference clock signal.

9. The system of claim 8, wherein the first transistor turns on a third transistor and a fourth transistor coupled to one another in a current mirror configuration, the fourth transistor functioning as a voltage clamp and also pulling up the output nodes toward a top voltage of the electrical energy storage pack during a first state of the reference clock signal.

10. The system of claim 1, wherein the plurality of series coupled electrical energy storage cells comprise N+1 electrical energy storage cells and the plurality of different voltage level clock signals comprise N different voltage level clock signals, where N is an integer greater than or equal to one, and wherein a top voltage of the electrical energy storage pack which is a positive terminal of a first electrical energy storage is utilized as a high output voltage level for a first different voltage level clock signal and a positive terminal of a second electrical energy storage of the series coupled batteries is utilized as a low output voltage level of the first different voltage level clock signal, and subsequent different voltage level clock signals are similarly provided until a positive electrical energy storage terminal of an Nth electrical energy storage is utilized as a high output voltage level for a Nth clock signal and a positive terminal of a N+1 electrical energy storage of the series coupled batteries is utilized as a low output voltage level of the Nth clock signal.

11. A circuit for generating a plurality of different voltage level clock signals, the circuit comprising:

an electrical energy storage pack having a plurality of series coupled electrical energy storage cells that provide a plurality of different output voltage levels;

a ground reference oscillator that provides a ground reference clock signal;

a plurality of series coupled transistor clamps that receive the plurality of different output voltage levels and output the plurality of different voltage level clock signals at respective output nodes, wherein the plurality of series coupled transistor clamps include a high-side transistor clamp and a low-side transistor clamp associated with each output node, the high-side transistor clamp clamps a respective output node at a respective high-side voltage level in response to pulling up the given output node toward a high output voltage level and the low-side transistor clamp clamps the respective output node at a respective low-side voltage level in response to pulling down the given output node toward a low output voltage level; and a rail selector that selects between pulling up each output node toward a high output voltage level and pulling down each output node toward a low output voltage level based on different states of the ground reference clock signal.

12. The circuit of claim 11, wherein each of the high-side transistor clamps are coupled to a respective high voltage output level and each of the low-side transistor clamps are coupled to a respective low output voltage level associated with a given different voltage level clock signal.

13. The circuit of claim 11, further comprising an inverter coupled to each output node to correct errors associated with the voltage drops across the transistor clamps.

14. The circuit of claim 11, wherein the rail selector comprises a first transistor that selects pulling up the output nodes toward a top voltage of the electrical energy storage pack during a first state of the reference clock signal and a second transistor that selects pulling down the output nodes toward a bottom voltage of the electrical energy storage pack during a second state of the reference clock signal.

15. The circuit of claim 14, wherein the first transistor turns on a third transistor and a fourth transistor coupled to one another in a current mirror configuration, the fourth transistor functioning as a voltage clamp and also pulling up the output nodes toward a top voltage of the electrical energy storage pack during a first state of the reference clock signal.

16. The circuit of claim 11, wherein the plurality of series coupled electrical energy storage cells comprise N+1 electrical energy storage cells and the plurality of different voltage level clock signals comprise N different voltage level clock signals, where N is an integer greater than or equal to one, and wherein a top voltage of the electrical energy storage pack which is a positive terminal of a first electrical energy storage is utilized as a high output voltage level for a first different voltage level clock signal and a positive terminal of a second electrical energy storage of the series coupled batteries is utilized as a low output voltage level of the first different voltage level clock signal, and subsequent different voltage level clock signals are similarly provided until a positive electrical energy storage terminal of an Nth electrical energy storage is utilized as a high output voltage level for a Nth clock signal and a positive terminal of a N+1 electrical energy storage of the series coupled batteries is utilized as a low output voltage level of the Nth clock signal.

17. A system for generating a plurality of different voltage level clock signals, the system comprising:

means for providing a plurality of different output voltage levels;

means for providing a reference clock signal;

means for clamping the plurality of different voltage level clock signals between a high-side voltage level and a low-side voltage level, the means for clamping receiving the plurality of different output voltage levels and outputting the plurality of different voltage level clock signals at respective output nodes, the means for clamping being configured to clamp each of a given output node to a respective high-side voltage level in response to pulling up of the given output node toward a respective high output voltage level and to clamp each of the given output node to a respective low-side voltage level in response to pulling down of the output node toward a low output voltage level; and means for selecting between pulling up each output node toward a high output voltage level and pulling down each output node toward a low output voltage level based on different states of the reference clock signal.

18. The system of claim 17, wherein the means for clamping include a first means for clamping each of a respective output node at the respective high-side voltage level and the means for clamping comprises a second means for clamping each of the respective output node at the respective low-side voltage level.

19. The system of claim 17, further comprising means for correcting each output node to correct errors associated with the means for clamping.

20. The system of claim 17, wherein the means for selecting comprises a first means for selecting that selects pulling up the output nodes toward a top voltage of the electrical energy storage pack during a first state of the reference clock signal and a second means for selecting that selects pulling down the output nodes toward a bottom voltage of the electrical energy storage pack during a second state of the reference clock signal.

* * * * *

UNITED STATES PATENT AND TRADEMARK OFFICE
CERTIFICATE OF CORRECTION

Page 1 of 1

PATENT NO.        : 8,149,040 B2
APPLICATION NO.   : 12/836865
DATED             : April 3, 2012
INVENTOR(S)       : Karthik Kadirvel, Umar Jameer Lyles and John H. Carpenter, Jr.

It is certified that error appears in the above-identified patent and that said Letters Patent is hereby corrected as shown below:

Title Page, Item (12)
"Kadirel et al." should be --Kadirvel et al.--.

Title Page, Item (75) Inventors, first inventor name,
"Karthik Kadirel" should be --Karthik Kadirvel--.

Signed and Sealed this
Eighth Day of July, 2014

Michelle K. Lee
*Deputy Director of the United States Patent and Trademark Office*